(12) United States Patent
Fang et al.

(10) Patent No.: US 11,043,546 B2
(45) Date of Patent: Jun. 22, 2021

(54) DISPLAY PANEL, FABRICATING METHOD THEREOF AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Liang Fang, Hubei (CN); Ding Ding, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/620,508

(22) PCT Filed: Jul. 26, 2019

(86) PCT No.: PCT/CN2019/097964
§ 371 (c)(1),
(2) Date: Dec. 8, 2019

(87) PCT Pub. No.: WO2020/232827
PCT Pub. Date: Nov. 26, 2020

(65) Prior Publication Data
US 2020/0373368 A1    Nov. 26, 2020

(30) Foreign Application Priority Data

May 20, 2019 (CN) .......................... 201910418486.3

(51) Int. Cl.
*H01L 27/32* (2006.01)
*H01L 51/56* (2006.01)
*H01L 51/00* (2006.01)

(52) U.S. Cl.
CPC .......... *H01L 27/3258* (2013.01); *H01L 51/56* (2013.01); *H01L 27/3276* (2013.01); *H01L 51/0097* (2013.01); *H01L 2227/323* (2013.01)

(58) Field of Classification Search
None
See application file for complete search history.

(56) References Cited

U.S. PATENT DOCUMENTS

| 10,658,628 B2 * | 5/2020 | Lee ...................... H01L 27/3279 |
| 2018/0047802 A1 * | 2/2018 | Yoon .................... H01L 27/3262 |
| 2018/0053816 A1 * | 2/2018 | Choi ................... H01L 51/0097 |
| 2018/0102399 A1 * | 4/2018 | Cho .................... H01L 27/3258 |

(Continued)

FOREIGN PATENT DOCUMENTS

| CN | 109390378 A | 2/2019 |
| JP | 2004134099 A | 4/2004 |
| WO | 2019026237 A1 | 2/2019 |

*Primary Examiner* — J. E. Schoenholtz
(74) *Attorney, Agent, or Firm* — Mark M. Friedman

(57) ABSTRACT

The invention discloses a display panel, a fabricating method thereof, and a display device. The display panel improves the covering structure of the metal wirings in the bending area, thereby improving the problem of poor coverage of metal wirings caused by stress concentration at the corners of the organic film layer in the bending area, and further reducing abnormalities such as holes and breaks in metal wirings.

8 Claims, 8 Drawing Sheets

(56) References Cited

U.S. PATENT DOCUMENTS

| | | | |
|---|---|---|---|
| 2018/0342707 A1* | 11/2018 | Lee | H01L 27/3279 |
| 2019/0041915 A1* | 2/2019 | Park | H01L 27/3262 |
| 2019/0355799 A1* | 11/2019 | Jeong | H01L 27/3265 |
| 2019/0355800 A1 | 11/2019 | Saitoh et al. | |
| 2020/0174528 A1 | 6/2020 | Park et al. | |

* cited by examiner

DISPLAY PANEL, FABRICATING METHOD THEREOF AND DISPLAY DEVICE

FIELD OF INVENTION

This invention relates to the field of display technologies, and in particular, to a display panel, a fabricating method thereof, and a display device.

BACKGROUND OF INVENTION

Organic Light-Emitting Diode (OLED) display device has gradually become the mainstream technology in the display field due to its advantages of low power consumption, high saturation, fast response time and wide viewing angle. It has a broad application space in the automotive, mobile, tablet, computer and TV products in the future.

In order to realize a narrow border of the OLED display device, a pad bending (PB) is usually designed in a down border (DB), wherein metal lines (ML) are disposed in the pad bending for signal transmission.

Technical Problems

Organic deep hole material (ODH) 16 is placed under the metal lines in the pad bending, due to the inherent characteristics of the organic deep hole material, when it is filled into a deep hole of a pad bending and patterned, the organic deep hole material 16 having a taper will form a step difference with the interlayer dielectric layer (ILD) 15 (ie, the ODH is higher than an upper surface height value of the ILD), as shown in FIG. 1A; the metal lines in the pad bending will be pre-cleaned with a certain concentration of hydrofluoric acid (HF) before film formation. Hydrofluoric acid will damage the interlayer dielectric layer 15 and increase the slope angle at the edge of the organic deep hole material 16, as shown in FIG. 1B. Coverage of the metal lines at the corners of the edges of the organic deep hole material is poor, which tends to cause stress concentration, and then cause abnormalities such as holes and breaks in the metal lines.

In view of this, it is urgent to provide a novel display panel to solve the above problems.

TECHNICAL SOLUTION

An object of the present invention is to provide a display panel, a fabricating method thereof, and a display device. The display panel improves the covering structure of the metal wirings in the bending area, thereby improving the problem of poor coverage of metal wirings caused by stress concentration at the corners of the organic film layer in the bending area, thereby further reducing abnormalities such as holes and breaks in the metal wirings.

According to an aspect of the present invention, the present invention provides a display panel, the display panel includes: a flexible substrate, the flexible substrate including a non-bending area and a bending area; an inorganic film layer disposed on the flexible substrate, a top of the inorganic film layer including an interlayer dielectric layer, the inorganic film layer in the bending area further including a deep hole region; a filling layer filled in a hole in the deep hole region, the filling layer protruding from an upper surface of the interlayer dielectric layer; and a protective layer disposed on the interlayer dielectric layer, and the protective layer covering a portion of the filling layer.

In an embodiment of the invention, a thickness of the protective layer is greater than a thickness of a threshold value.

In an embodiment of the invention, in the bending area, the display panel further includes a metal wiring layer, and the metal wiring layer is disposed on the filling layer and the protective layer.

In an embodiment of the invention, the protective layer includes a groove perpendicular to a metal wiring direction of the metal wiring layer.

In an embodiment of the invention, the protective layer is made of an inorganic material.

According to another aspect of the present invention, a method for fabrication the abovementioned display panel, the method includes the steps of: (1) providing a flexible substrate, the flexible substrate including a non-bending area and a bending area, forming an inorganic film layer on the flexible substrate, a top of the inorganic film layer including an interlayer dielectric layer, the inorganic film layer further including a deep hole region disposed in the bending area; (2) etching the deep hole region to form a hole having a slope, a bottom of the hole located on the flexible substrate; (3) filling the hole with an organic material to form a filling layer, and the filling layer protruding from an upper surface of the interlayer dielectric layer; (4) disposing a protective layer on the interlayer dielectric layer, the protective layer covering a portion of the filling layer; (5) patterning the protective layer, the interlayer dielectric layer, and the filling layer to form a contact hole, and removing a part of the protective layer and a part of the filling layer in the bending area; (6) depositing a metal wiring layer on the protective layer and the filling layer, and patterning by a mask.

In an embodiment of the invention, in the step (5), the protective layer and the interlayer dielectric layer in the non-bending area and the protective layer and the filling layer in the bending area are patterned by using the same mask, wherein a thickness of the removed part of the filling layer depends on a thickness of the interlayer dielectric layer in the non-bending area.

In an embodiment of the invention, in the step (5), the protective layer and the interlayer dielectric layer in the non-bending area and the protective layer and the filling layer in the bending area are patterned by using two different masks, wherein a thickness of the removed part of the filling layer is 10% to 90% of a height difference between the upper surface of the organic film layer and the upper surface of the protective layer.

In an embodiment of the invention, after the step (6), further includes: depositing a flat layer on the metal trace layer, and patterning the flat layer to form a contact hole; forming a pixel electrode layer on the patterned flat layer and patterning the pixel electrode layer; depositing a pixel defining layer and a spacer layer on the patterned pixel electrode layer, and disposing a light emitting layer in an open region of the pixel defining layer.

According to another aspect of the present invention, the invention further provides a display device, the display device includes the abovementioned display panel.

Beneficial Effect

The advantage of the invention is that the display panel of the present invention provides a novel structural design for the problem of poor coverage of metal wirings in the bending area, by adding a protective layer between the interlayer dielectric layer and the metal wiring layer, the protective layer can prevent the damage caused by hydrofluoric acid on the cleaning of the interlayer dielectric layer, and can reduce the stress concentration at the edge of the organic film layer, thereby improving the coverage of the metal wirings at the edge of the organic deep hole material, reducing abnormalities such as holes and breaks in metal wirings, and improving the reliability of the display panel.

DESCRIPTION OF DRAWINGS

In order to more clearly illustrate the technical solutions in the embodiments of the present invention, the drawings to be used in the embodiments will be briefly described below. It is obvious that the drawings in the following description are merely some of the embodiments of the present invention, and other drawings may be obtained based on these figures by those skilled in the art without any creative work.

EMBODIMENTS OF THIS INVENTION

Figure 1A:
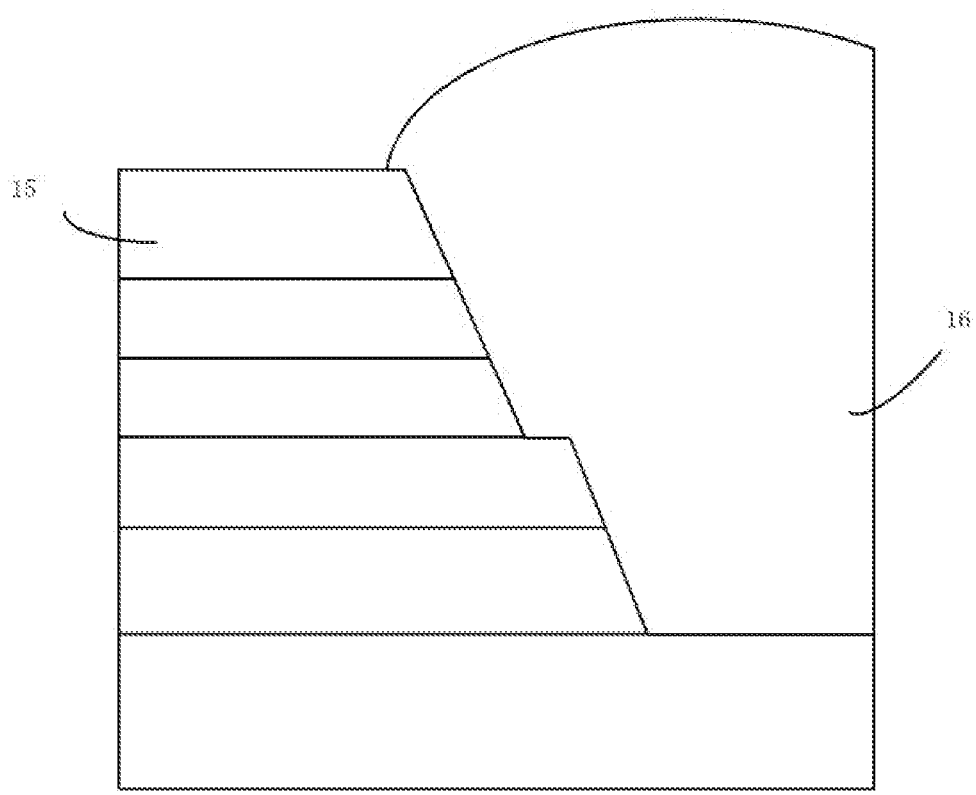
FIG. 1A and FIG. 1B are a schematic structural view of a bending area of a conventional organic light-emitting diode display device, and a schematic view of a portion of the interlayer dielectric layer damaged by pre-cleaning of the metal wirings of the metal wiring layer of the bending area.

The technical solutions in the embodiments of the present invention are clearly and completely described in the following with reference to the accompanying drawings in the embodiments of the present invention. It is obvious that the described embodiments are only part of the embodiments of the invention, and not all of the embodiments. All other embodiments obtained by those of ordinary skill in the art based on the embodiments of the present invention are within the scope of the present invention.

The terms "first," "second," "third," if any, in the description, the claims, and the drawings may be used for distinguishing between similar elements and not necessarily for describing a particular sequential or chronological order. It is to be understood that the terms are interchangeable. Furthermore, the terms "comprise," "include," "have," and any variations thereof, are intended to cover non-exclusive inclusions.

In the patent specification, the drawings discussed below and the various embodiments used to describe the principles of the present invention are intended to be illustrative only, and are not to be construed as limiting the scope of the invention. Those skilled in the art will appreciate that the principles of the present invention can be implemented in any suitably arranged system. Exemplary embodiments will be described in detail, and examples of these embodiments are illustrated in the accompanying drawings. Further, an end according to an exemplary embodiment will be described in detail with reference to the accompanying drawings. The same reference numbers in the drawings denote the same elements.

The terms used in the description of the present invention are only used to describe specific embodiments, and are not intended to show the concepts of the present invention. Unless explicitly described to the difference, a singular form includes a plural form in the present specification. In the specification of the present invention, it is to be understood that the terms such as "including," "having," and "comprising" are intended to indicate the existence of the features, numbers, steps, actions, or combinations in the invention, and are not intended to preclude the possibility that one or more other features, numbers, steps, actions, or combinations thereof may exist or may be added. The same reference number represents the same element in all drawings. The embodiment of the present invention provides a display panel, a fabricating method thereof, and a display device, and they will be described separately below.

Figure 2:
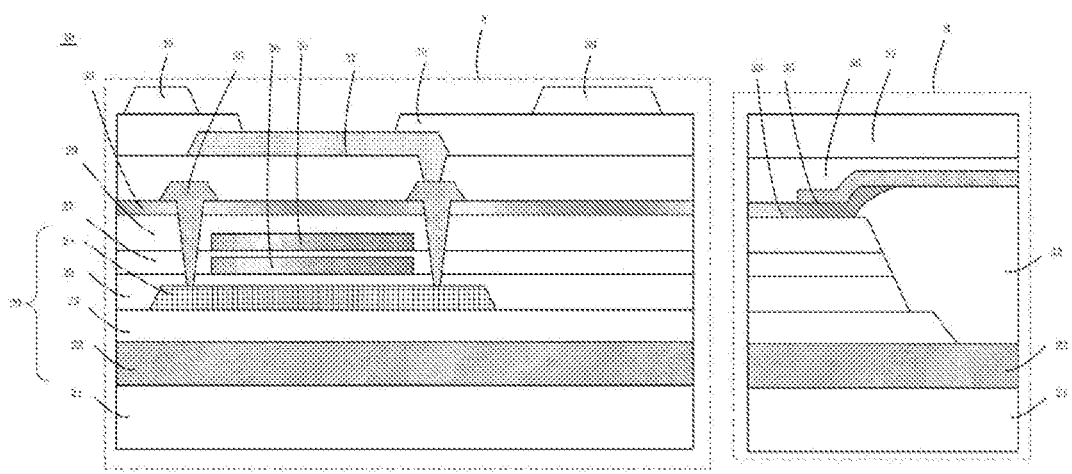
FIG. 2 is a schematic structural view of a display panel in an embodiment of the present invention.
Figure 3A:
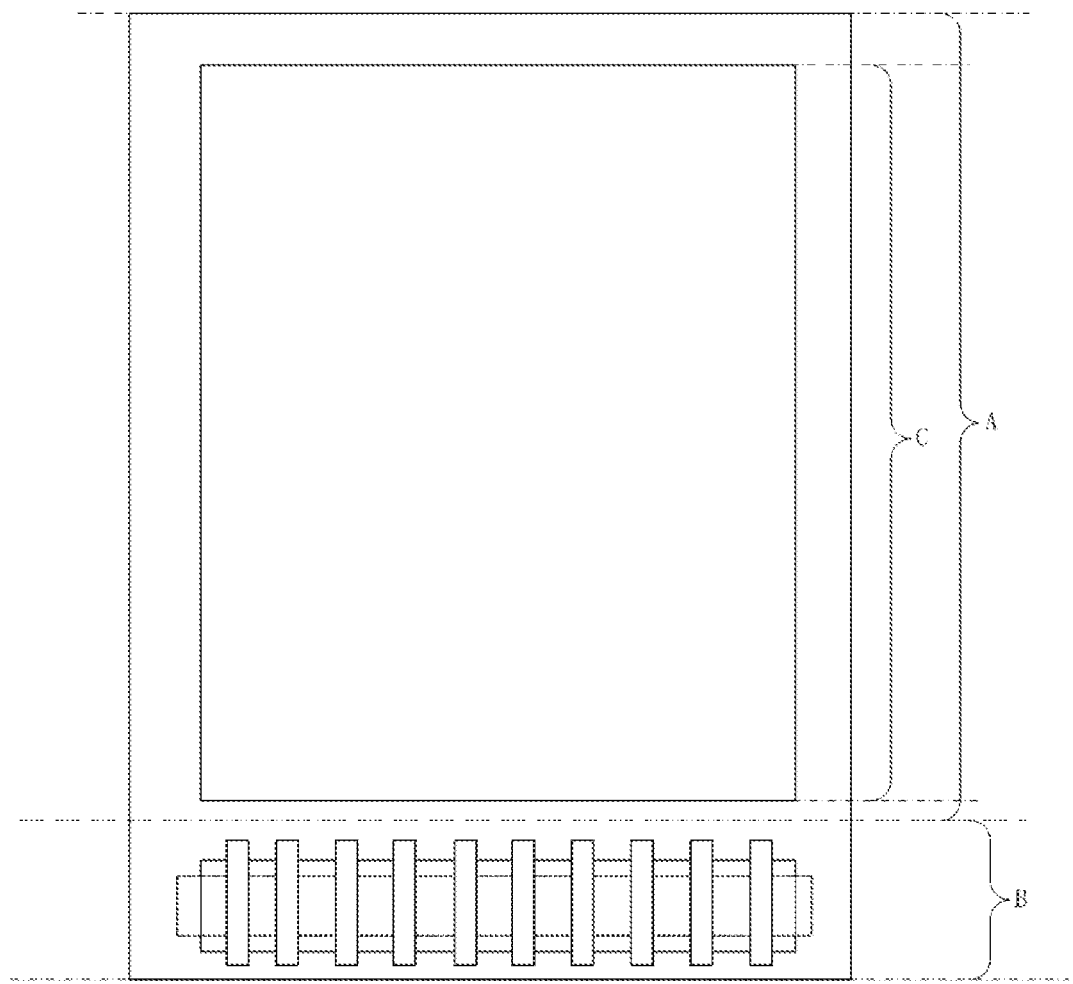
FIG. 3A and FIG. 3B are schematic structural views from another angle of the display panel in the embodiment of the present invention.
Figure 3B:
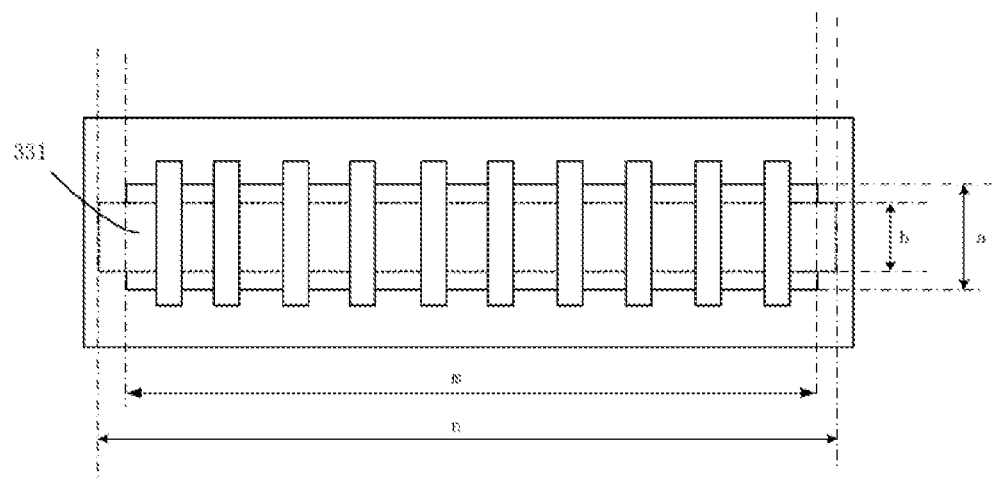
Figure 4:
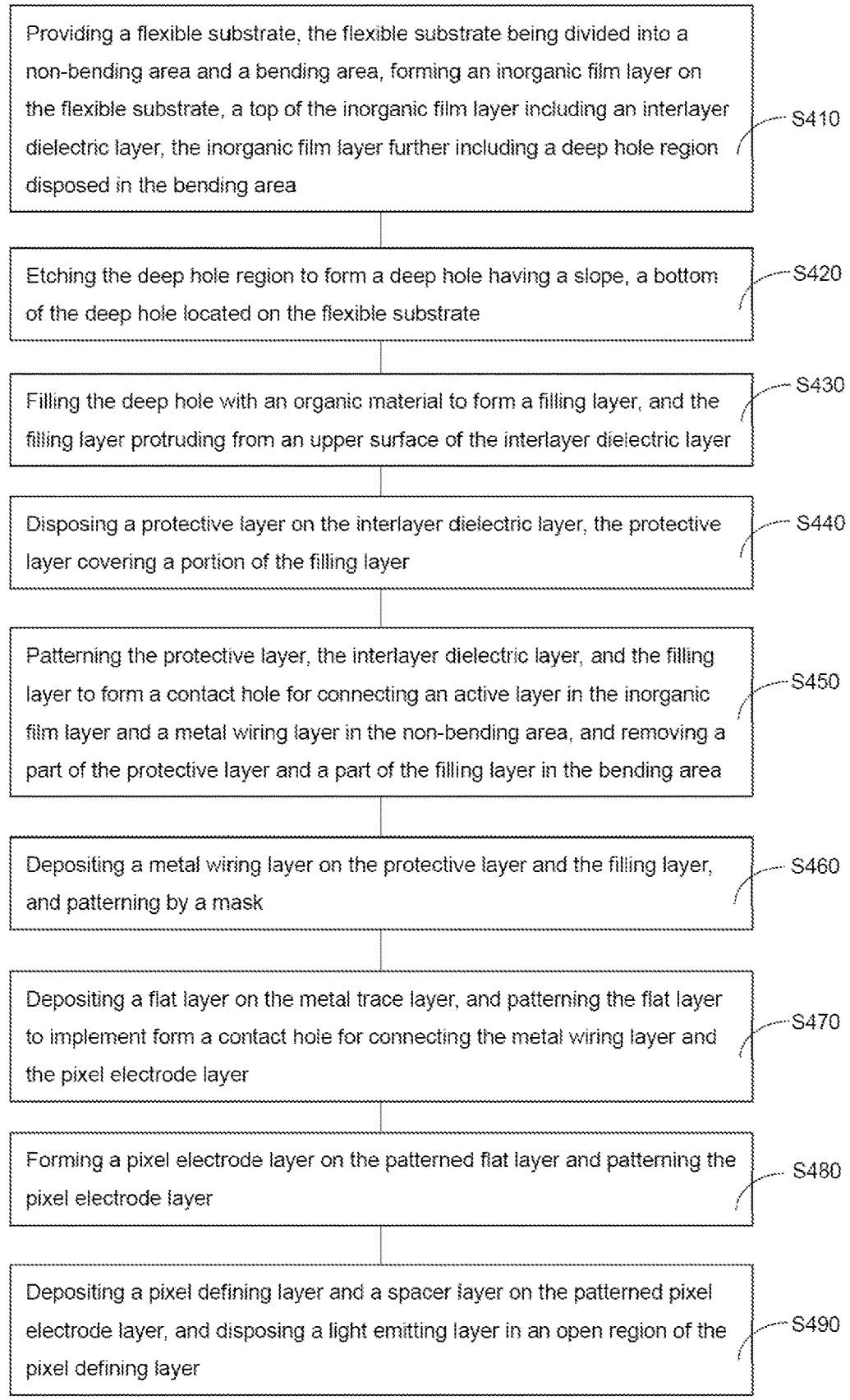
FIG. 4 is a flow chart showing the steps of a method of fabricating a display panel in an embodiment of the present invention.

Referring to FIG. 2, FIG. 3A and FIG. 3B. FIG. 2 is a schematic structural view of a display panel in an embodiment of the present invention. FIG. 3A and FIG. 3B are structural schematic views from another angle of the display panel in the embodiment of the present invention.

This invention provides a display panel 10, the display panel 10 includes a flexible substrate 21. Material of the flexible substrate 21 is made of a polymer material such as polyimide plastic, poly-ether-ether-ketone or transparent conductive polyester. In the present embodiment, polyimide (PI) material is adopted, and polyimide material has high temperature resistance, wide temperature range, no obvious melting point, high insulation property, and stable dielectric constant, so it is widely used in the flexible substrate 21.

An inorganic film layer 20 is disposed on the flexible substrate 21, a top of the inorganic film layer 20 includes an interlayer dielectric layer 29. The inorganic film layer 20 further includes, but is not limited to, a barrier layer 22, a buffer layer 23, an active layer 24, gate insulating layers 25, 27, and gate layers 26, 28. Wherein, the barrier layer 22 and the buffer layer 23 are used for buffering and protection. The active layer 24 is polysiliconized by the excimer laser crystallization technique. In the embodiment, the gate insulating layers include a first gate insulating layer 25 and a second gate insulating layer 27.

The flexible substrate is divided into a non-bending area A and a bending area B. As shown in FIG. 3A and FIG. 3B, the non-bending area A means an area that does not need to be bent, and the bending area B means an area that needs to be bent. The flexible substrate 21 and the inorganic film layer 20 extend from the non-bending area A to the bending area B, that is, the flexible substrate 21 and the inorganic film layer 20 are also divided into a non-bending area A and a bending area B. As shown in FIG. 3A, the non-bending area A further includes a display area C, the bending area B is disposed on one side of the display area C.

The inorganic film layer 20 in the bending area B further includes a deep hole region (not shown), a filling layer (hereinafter replaced by an organic film layer) 32 is filled in a hole 31 of the deep hole region, and the filling layer 32 protrudes from an upper surface of the interlayer dielectric layer 29. In this embodiment, the filling layer 32 is organic material such as an organic deep hole material, and thus the filling layer is replaced by the organic film layer 32 hereinafter. In the bending area B, the display panel 10 further includes a metal wiring layer 35, and the metal wiring layer 35 is disposed on the filling layer 32 and a protective layer 33. The metal wiring layer 35 herein means a source/drain layer. The metal wiring layer 35 includes a plurality of metal wirings.

Figure 1B:
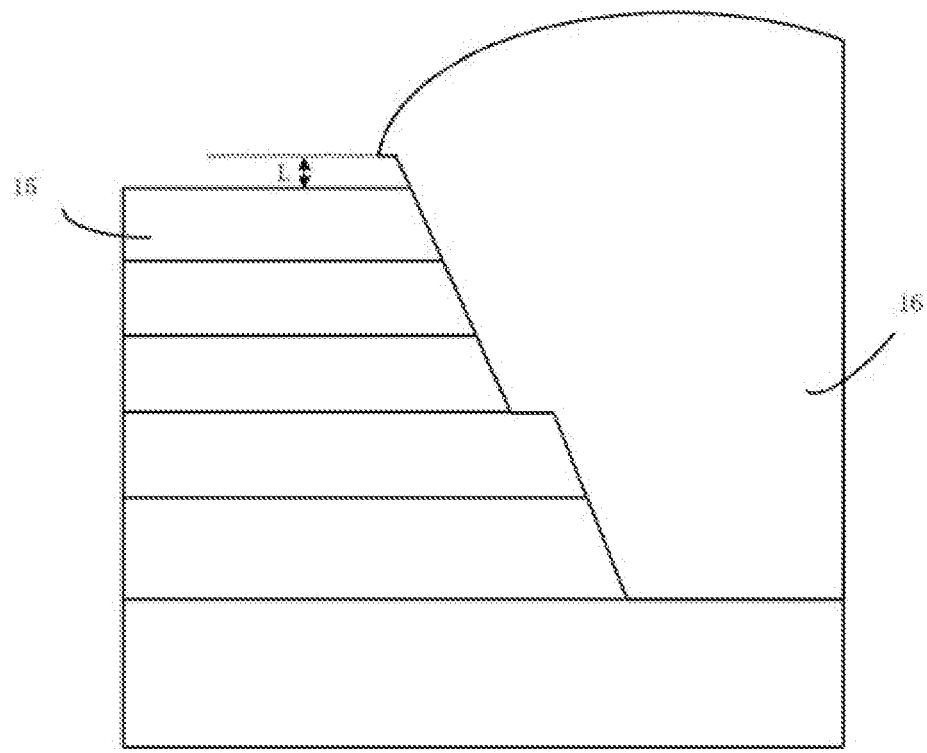

Since in the prior art, when the organic deep hole material is filled into the holes in the bending area B and patterned, the organic deep hole material having a taper forms a height difference with the interlayer dielectric layer 29 (ie, the ODH is higher than an upper surface height value of the ILD); the metal wirings in the bend area B (which can be replaced by the metal wiring layer 35) is pre-cleaned with a certain concentration of hydrofluoric acid (HF) before the film formation, and the hydrofluoric acid causes damage to the interlayer dielectric layer 29, which increases the slope angle at the edge of the organic deep hole material. Therefore, in the present invention, a protective layer 33 is disposed on the interlayer dielectric layer 29, and the protective layer 33 covers a portion of the fill layer 32. Further, a thickness of the protective layer 32 is greater than a thickness of a threshold value, which is a thickness at which the hydrogen-containing fluorocarbon causes damage to the interlayer dielectric layer 29. Thus, by disposing the protective layer 33, not only the interlayer dielectric layer 29 can be protected from damage by hydrofluoric acid, but also the height difference between the organic deep hole material and the interlayer dielectric layer 29 can be reduced (L shown in FIG. 1 B), so that the coverage of the metal wiring layer 35 disposed in the bending area B and at the edge of the organic film layer 32 (ie, the position where the organic film layer 32 intersects the interlayer dielectric layer 29) is improved, thereby further reducing abnormalities such as holes and breaks in the metal wirings.

In the present embodiment, the protective layer 33 is made of an inorganic material, such as, but not limited to, silicon dioxide. In addition, the protective layer 33 includes a groove perpendicular to a metal wiring direction of the metal wiring layer 35. That is, in a direction parallel to the metal wiring direction, the protective layer 33 in the bending area B is partially etched, and in a direction perpendicular to the metal wiring direction, the protective layer 33 in the bending area B is entirely etched. The etched region of the protective layer 33 in the bending area B satisfies the condition that n>m, 0.1a<b<0.9*a, wherein m and a are a length and a width of the bending area B, respectively, and n and b are a length and a width of the etched region of the protective layer 33 in the bending area B, respectively, as shown in FIG. 3B. By designing such a protective layer 33, the protective layer 33 has a good bending property when the bending area B of the display panel 10 is bent, thereby the bending resistance of the metal wiring layer 35 provided on the protective layer 33 and the organic film layer 32 is further ensured.

It should be noted that when the protective layer 33 is etched, patterning may be performed by wet etching or dry etching. Wherein in the display area C, a contact hole 34 for connecting the active layer 24 and the metal wiring layer 35 is formed, and in the bending area B, the protective layer 33 in the central part is removed, and the display area C and the bending area B may be patterned using the same mask, or the display area C and the bending area B may be patterned using two different masks.

Further, when the protective layer 33 is etched, a part of the organic film layer 32 is removed, which also reduces the difference in height between the upper surface of the organic film layer 32 and the upper surface of the interlayer dielectric layer 29. When the same mask (i.e., the mask for the interlayer dielectric layer 29) is employed, the thickness of the removed part of the organic film layer 32 is determined according to the thickness of the interlayer dielectric layer 29 in the display area C. When different masks are used, that is, when the protective layer 33 and the interlayer dielectric layer 29 in the non-bending area A, and the protective layer 33 and the organic film layer 32 in the bending area B are respectively patterned, a thickness of the removed part of the organic film layer 32 is 10% to 90% of a height difference between the upper surface of the organic film layer and the upper surface of the protective layer 33.

Therefore, the display panel 10 of the present invention is provided with a protective layer 33 on the interlayer dielectric layer 29 for preventing damage of the interlayer dielectric layer 29 by hydrofluoric acid, and a part of the organic film layer 32 is removed to further reduce the slope angle at the edge of the organic film layer 32 and reduce the stress concentration at the edge of the organic film layer 32, thereby improving the coverage of the metal wirings at the edge of the organic film layer 32, reducing abnormalities such as holes and breaks in metal wirings, and improving the reliability of the display panel 10.

Referring to FIG. 4 and FIGS. 5A to 5L, FIG. 4 is a flow chart showing the steps of the method for fabricating the display panel 10 according to an embodiment of the present invention. FIGS. 5A to 5L are process flow views of a method of fabricating the display panel 10 in the embodiment of the present invention.

Figure 5A:
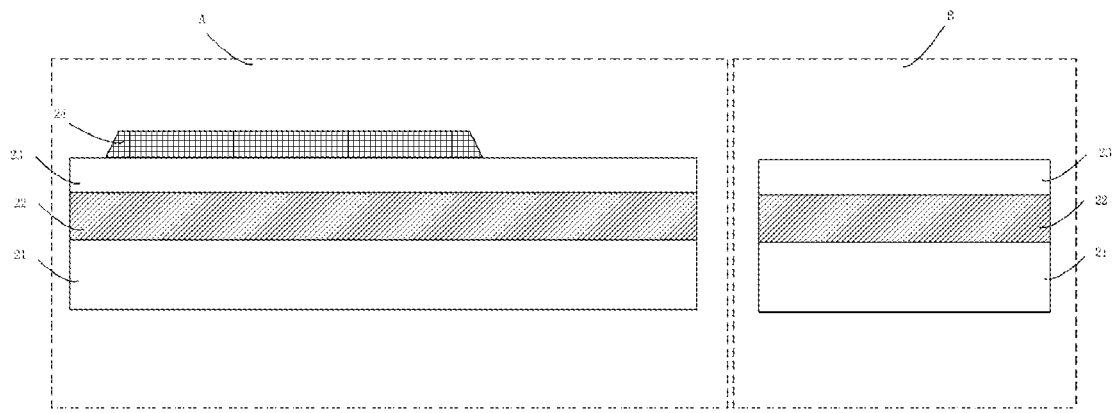
FIGS. 5A to 5L are process flow views of a method of fabricating a display panel in the embodiment of the present invention.
Figure 5B:
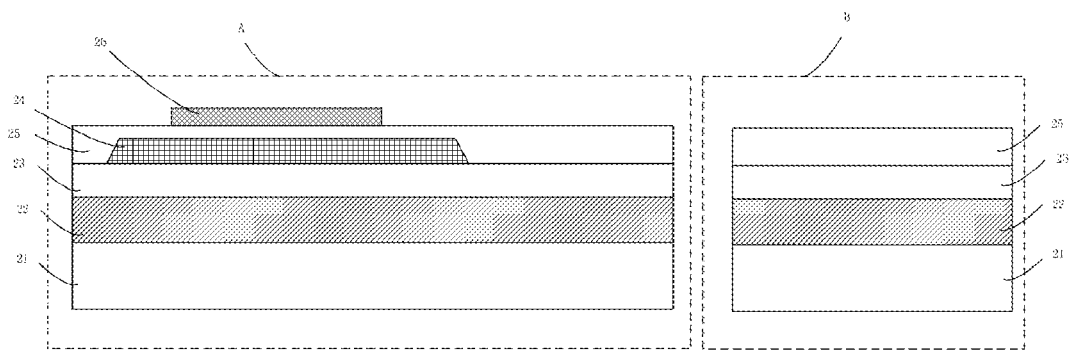

The present invention also provides a method of fabricating the abovementioned display panel 10, the method includes the following steps:

As shown in FIG. 5A and FIG. 5B, step S410: providing a flexible substrate, the flexible substrate being divided into a non-bending area and a bending area, forming an inorganic film layer 20 on the flexible substrate, a top of the inorganic film layer 20 including an interlayer dielectric layer 29, the inorganic film layer 20 further including a deep hole region disposed in the bending area.

Figure 5C:
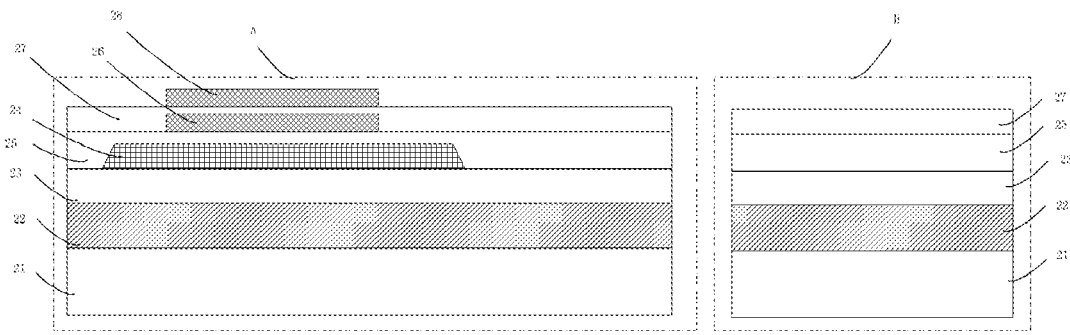
Figure 5D:
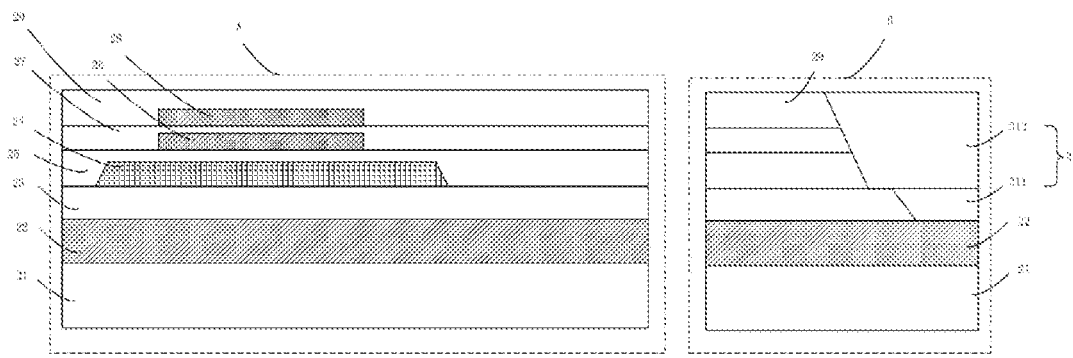

This step further includes depositing and forming a barrier layer 22 and a buffer layer 23 successively on the flexible substrate 21, The barrier layer 22 and the buffer layer 23 are used for buffering and protection. Next, an active layer 24 is deposited on the buffer layer 23, polysiliconization of the active layer 24 is performed by an excimer laser crystallization technique, and patterning of the active layer 24 is performed using a mask. Then, a first gate insulating layer 25 and a first gate layer 26 are successively deposited, and patterned by a mask, and ion implantation is performed with the first gate layer 26 serving as a mask, as shown in FIG. 5C. Further, a second gate insulating layer 27 and a second gate layer 28 are successively deposited, and patterned by a mask, as shown in FIG. 5D. Next, an interlayer dielectric layer 29 is deposited over the second gate layer.

Step S420: etching the deep hole region to form a hole 31 having a slope, a bottom of the hole 31 located on the flexible substrate.

In the bending area, the deep hole region is etched by two masks to form a hole 31, which includes a first hole 311 and a second hole 312, as shown in FIG. 5D.

Step S430: filling the hole with an organic material to form a filling layer, and the filling layer 32 protruding from an upper surface of the interlayer dielectric layer 29.

Figure 5E:
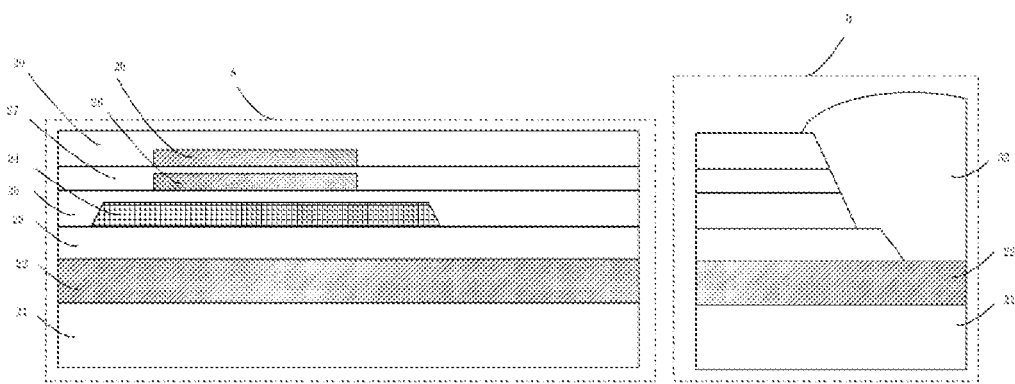

The hole in the bending area is filled with an organic deep hole material. Since the organic deep hole material has a fixed characteristic, there is a certain height difference (a difference in height between the upper surface of the organic film layer 32 and the upper surface of the interlayer dielectric layer 29) and the slope after filling, as shown in FIG. 5E.

Step S440: disposing a protective layer on the interlayer dielectric layer, the protective layer covering a portion of the filling layer.

A protective layer 33 is deposited on the interlayer dielectric layer 29. The protective layer 33 is made of an inorganic material such as silicon dioxide.

Figure 5F:
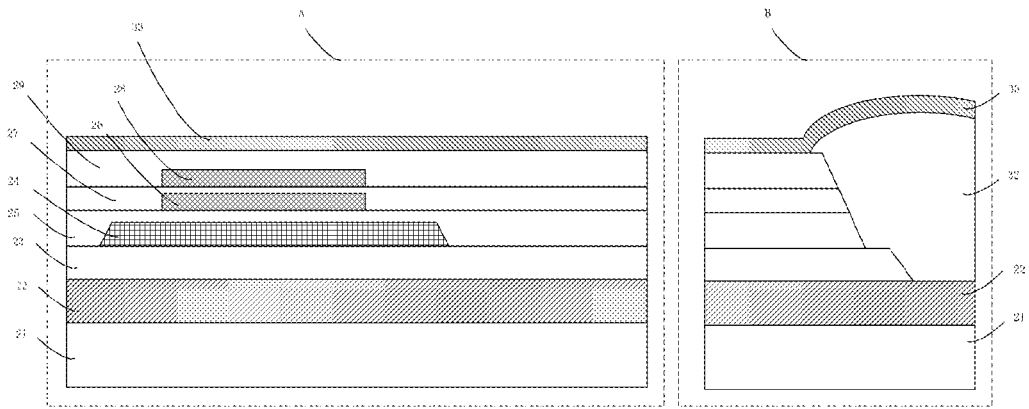

The protective layer 33 has the characteristics of high stress suitability and good step coverage, and can prevent the hydrofluoric acid from damaging the interlayer dielectric layer 29 at the edge of the organic film layer 32, thereby optimizing the stress concentration at the edge of the organic film layer 32. Thereby, the coverage of the metal wirings in the metal wiring layer 35 provided on the protective layer 33 and the organic film layer 32 is improved as shown in FIG. 5F.

Step S450: patterning the protective layer, the interlayer dielectric layer, and the filling layer 32 to form a contact hole 34 for connecting an active layer 24 in the inorganic film layer 20 and a metal wiring layer 35 in the non-bending area, and removing a part of the protective layer and a part of the filling layer 32 in the bending area.

Figure 5G:
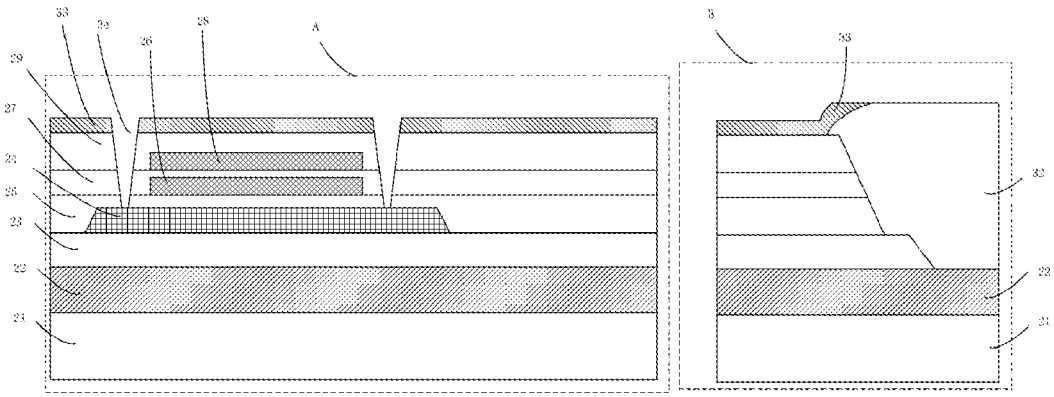
Figure 5H:
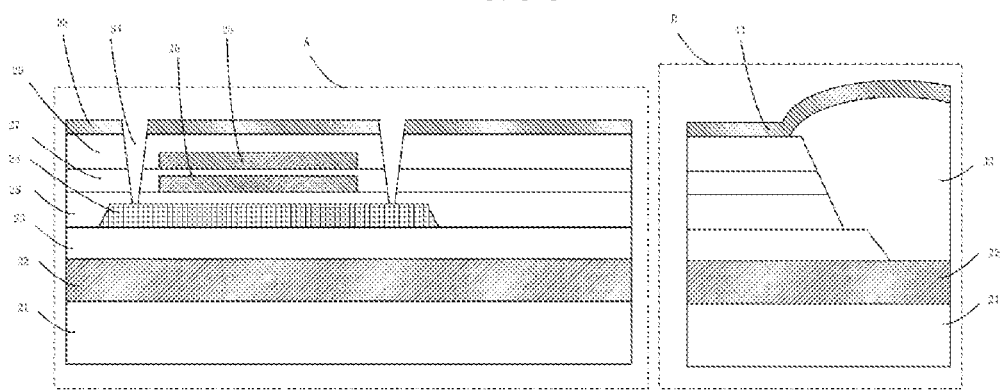
Figure 5I:
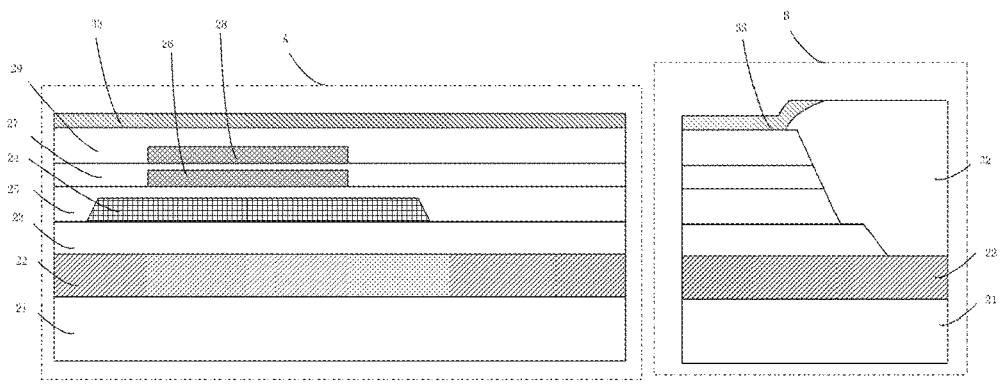

In this step, a process as shown in FIG. 5G may be employed, that is, the display area C and the bending area are patterned simultaneously by using the same mask. A thickness of the removed part of the organic film layer 32 at this time depends on a thickness of the interlayer dielectric layer 29 in the non-bending area A. Of course, in other embodiments, as shown in FIG. 5H and FIG. 5I (the process shown in FIG. 5H and FIG. 5I can be exchanged), the protective layer 33 and the interlayer dielectric layer 29 in the non-bending area A and the protective layer 33 and the filling layer 32 in the bending area are patterned by using two different masks, wherein a thickness of the removed part of the organic film layer 32 is 10% to 90% of a height difference between the upper surface of the organic film layer and the upper surface of the protective layer 33.

Figure 5J:
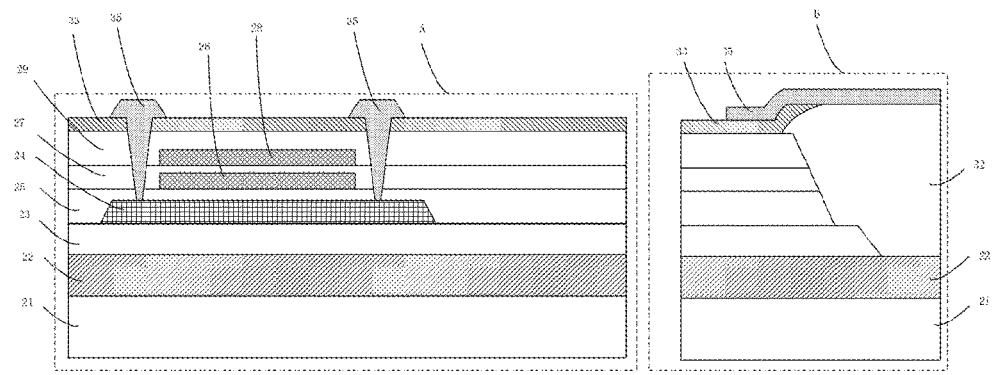

Step S460: depositing a metal wiring layer 35 on the protective layer 33 and the filling layer 32, and patterning by a mask, as shown in FIG. 5J.

Figure 5K:
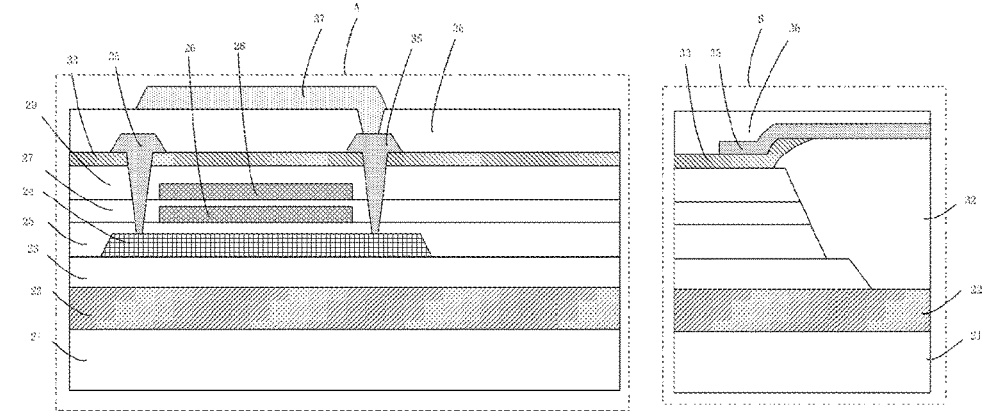

Step S470: depositing a flat layer 36 on the metal trace layer 35, and patterning the flat layer 36 to form a contact hole, as shown in FIG. 5K.

Step S480: forming a pixel electrode layer 37 on the patterned flat layer 36 and patterning the pixel electrode layer 37.

The pixel electrode layer 37 is patterned by a mask in this step.

Figure 5L:
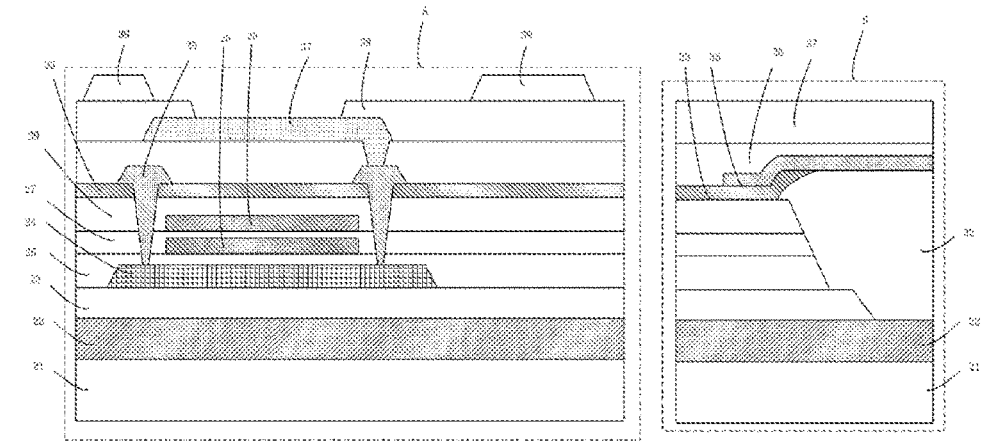

As shown in FIG. 5L, step S490: depositing a pixel defining layer 38 and a spacer layer 39 on the patterned pixel electrode layer 37, and disposing a light emitting layer (not shown) in an open region of the pixel defining layer.

In this step, the patterning is performed by using a single or two masks, and a light emitting layer is disposed in the open region of the pixel defining layer 38 to complete the fabrication of the light-emitting layer.

Figure 6:
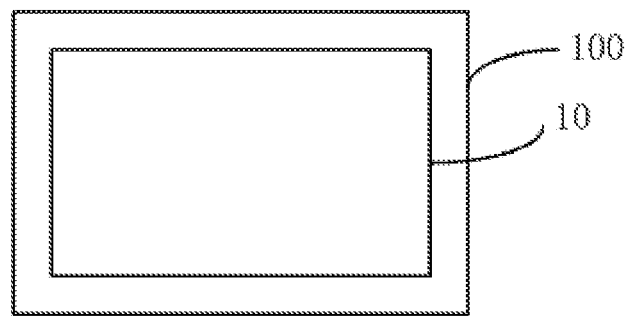
FIG. 6 is a schematic structural view of a display device in an embodiment of the present invention.

According to still another aspect of the present invention, as shown in FIG. 6, the present invention further provides a display device 100 including the abovementioned display panel 10. The specific structure of the display panel 10 will not be repeated herein.

The advantage of the invention is that the display panel 10 of the present invention provides a novel structural design for the problem of poor coverage of metal wirings in the bending area, by adding a protective layer 33 between the interlayer dielectric layer 29 and the metal wiring layer 35, the protective layer 33 can prevent the damage caused by hydrofluoric acid on the cleaning of the interlayer dielectric layer 29, and can reduce the stress concentration at the edge of the organic film layer 32, thereby improving the coverage of the metal wirings at the edge of the organic deep hole material, reducing abnormalities such as holes and breaks in metal wirings, and improving the reliability of the display panel 10.

The above description is only a preferred embodiment of the present invention, and it should be noted that those skilled in the art can also make several improvements and modifications without departing from the principles of the present invention, and these improvements and modifications should also be considered as protection of the present invention.

INDUSTRIAL APPLICABILITY

The subject matter of the present application can be manufactured and used in the industry and has industrial applicability.

What is claimed is:
1. A display panel, comprising:
a flexible substrate, the flexible substrate comprising a non-bending area and a bending area;
an inorganic film layer disposed on the flexible substrate, a top of the inorganic film layer comprising an interlayer dielectric layer, the inorganic film layer in the bending area further comprising a deep hole region;
a filling layer filled in a hole in the deep hole region, the filling layer protruding from an upper surface of the interlayer dielectric layer;
a protective layer disposed on the interlayer dielectric layer, and the protective layer covering a portion of the filling layer; and
a metal wiring layer disposed on the filling layer and the protective layer in the bending area;
wherein the protective layer comprises a groove perpendicular to a metal wiring direction of the metal wiring layer.

2. The display panel as claimed in claim 1, wherein a thickness of the protective layer is greater than a threshold thickness which is a thickness at which hydrogen-containing fluorocarbon causes damage to the interlayer dielectric layer.

3. The display panel as claimed in claim 1, wherein the protective layer is made of an inorganic material.

4. A method for fabricating the display panel as claimed in claim 1, wherein the method comprises steps of:
(1) providing the flexible substrate, the flexible substrate comprising the non-bending area and the bending area, forming the inorganic film layer on the flexible substrate, the top of the inorganic film layer comprising the interlayer dielectric layer, the inorganic film layer further comprising the deep hole region disposed in the bending area;
(2) etching the deep hole region to form the hole having a slope, a bottom of the hole located on the flexible substrate;
(3) filling the hole with an organic material to form the filling layer, and the filling layer protruding from the upper surface of the interlayer dielectric layer;
(4) disposing the protective layer on the interlayer dielectric layer, the protective layer covering the portion of the filling layer;
(5) patterning the protective layer, the interlayer dielectric layer, and the filling layer to form a contact hole, and removing a part of the protective layer and a part of the filling layer in the bending area; and (6) depositing the metal wiring layer on the protective layer and the filling layer, and patterning by a mask.

5. The method as claimed in claim 4, wherein in the step (5), the protective layer and the interlayer dielectric layer in the non-bending area and the protective layer and the filling layer in the bending area are patterned by using a same mask.

6. The method as claimed in claim 4, wherein in the step (5), the protective layer and the interlayer dielectric layer in the non-bending area and the protective layer and the filling layer in the bending area are patterned by using two different masks, wherein a thickness of a removed part of the filling layer is 10% to 90% of a height difference between an upper surface of the filling layer and an upper surface of the protective layer.

7. The method as claimed in claim 4, wherein after the step (6), further comprises:
  depositing a flat layer on the metal wiring layer, and patterning the flat layer to form the contact hole;
  forming a pixel electrode layer on the patterned flat layer and patterning the pixel electrode layer;
  depositing a pixel defining layer and a spacer layer on the patterned pixel electrode layer, and disposing a light emitting layer in an open region of the pixel defining layer.

8. A display device, wherein the display device comprises the display panel as claimed in claim 1.

\* \* \* \* \*